(12) United States Patent
Jaiswal et al.

(10) Patent No.: US 10,991,406 B2
(45) Date of Patent: Apr. 27, 2021

(54) METHOD, SYSTEM AND DEVICE FOR MAGNETIC MEMORY

(71) Applicant: Arm Limited, Cambridge (GB)

(72) Inventors: Akhilesh Ramlaut Jaiswal, West Lafayette, IN (US); Mudit Bhargava, Austin, TX (US)

(73) Assignee: Arm Limited, Cambridge (GB)

(*) Notice: Subject to any disclaimer, the term of this patent is extended or adjusted under 35 U.S.C. 154(b) by 0 days.

(21) Appl. No.: 16/200,276

(22) Filed: Nov. 26, 2018

(65) Prior Publication Data

US 2020/0168261 A1 May 28, 2020

(51) Int. Cl.

| | | |
|---|---|---|
| *G11C 11/16* | (2006.01) | |
| *H01L 27/22* | (2006.01) | |
| *H01L 43/02* | (2006.01) | |
| *G11C 11/56* | (2006.01) | |
| *G11C 11/18* | (2006.01) | |
| *H01L 43/10* | (2006.01) | |

(52) U.S. Cl.
CPC ........ *G11C 11/161* (2013.01); *G11C 11/1655* (2013.01); *G11C 11/1659* (2013.01); *G11C 11/1673* (2013.01); *G11C 11/1675* (2013.01); *G11C 11/18* (2013.01); *G11C 11/5607* (2013.01); *H01L 27/222* (2013.01); *H01L 43/02* (2013.01); *H01L 43/10* (2013.01)

(58) Field of Classification Search
CPC .............. G11C 11/161; G11C 11/1655; G11C 11/1673; G11C 11/1675; G11C 11/5607; G11C 11/1659; G11C 11/18; H01L 27/222; H01L 43/02; H01L 43/10
See application file for complete search history.

(56) References Cited

U.S. PATENT DOCUMENTS

| | | | |
|---|---|---|---|
| 9,218,864 B1* | 12/2015 | Yi | H01L 43/08 |
| 9,269,415 B1* | 2/2016 | Liu | H01L 43/08 |
| 9,858,975 B1 | 1/2018 | Hatcher | |
| 10,593,397 B1* | 3/2020 | Jaiswal | G11C 11/1659 |
| 2013/0322161 A1* | 12/2013 | Noguchi | G11C 11/1675 365/158 |
| 2014/0264513 A1* | 9/2014 | De Brosse | H01L 43/065 257/295 |
| 2016/0197263 A1* | 7/2016 | Hu | G11C 11/1675 365/158 |
| 2018/0033954 A1* | 2/2018 | Aradhya | H01F 10/3272 |
| 2018/0240966 A1* | 8/2018 | Mihajlovic | H01L 27/228 |
| 2019/0051815 A1* | 2/2019 | Kakinuma | G11C 11/18 |
| 2019/0079701 A1* | 3/2019 | Rakshit | G06F 3/0616 |
| 2019/0244646 A1* | 8/2019 | Lee | H01F 10/3254 |
| 2019/0259810 A1* | 8/2019 | Jacob | H01L 43/02 |
| 2019/0295619 A1* | 9/2019 | Inokuchi | H01L 43/08 |
| 2019/0304523 A1* | 10/2019 | O'Brien | H01L 27/228 |
| 2020/0006630 A1* | 1/2020 | Sato | H01L 43/12 |

OTHER PUBLICATIONS

Notification of Transmittal of the International Search Report and the Written Opinion of the International Searching Authority, or the Declaration, dated Feb. 7, 2020, International Application No. PCT/GB2019/053258, 1 pg.

(Continued)

*Primary Examiner* — Jay W. Radke

(74) *Attorney, Agent, or Firm* — Berkeley Law & Technology Group, LLP

(57) ABSTRACT

Disclosed are techniques for forming and operating magnetic memory devices.

22 Claims, 8 Drawing Sheets

(56) References Cited

OTHER PUBLICATIONS

International Search Report, dated Feb. 7, 2020, International Application No. PCT/GB2019/053258, 4 pgs.
Written Opinion of the International Searching Authority, dated Feb. 7, 2020, International Application No. PCT/GB2019/053258, 9 pgs.
Kim, et. al., "DSH-MRAM: Differential Spin Hall MRAM for On-Chip Memories", IEEE Electron Device Letters, vol. 34, No. 10, Oct. 2013, 3pgs.
J. Ryu and K. Kwon, "A Reliable 2T2MTJ Nonvolatile Static Gain Cell STT-MRAM With Self-Referencing Sensing Circuits for Embedded Memory Application," in IEEE Transactions on Magnetics, vol. 52, No. 4, pp. 1-10, Apr. 2016, Art No. 3400310.
Sato, et. al., "Physical Characterization of Two-Terminal SOT-MRAM Cell", Standford University, Department of Engineering, Jun. 2018, 19 pgs.
U.S. Appl. No. 16/201,080, filed Nov. 27, 2018, 117 pgs.
Filing Receipt mailed Dec. 31, 2018, U.S. Appl. No. 16/201,080, 3 pgs.
Notice to File Corrected Application Papers dated Dec. 31, 2018, U.S. Appl. No. 16/201,080, 2 pgs.
Response to Notice to File Corrected Application Papers filed Feb. 26, 2019, U.S. Appl. No. 16/201,080, 10 pgs.
International Patent Application No. PCT/GB2019/053258 as filed Nov. 15, 2019, 78 pgs.
Office Action, U.S. Appl. No. 16/201,080, dated Aug. 7, 2020, 31 Pages.
Response to Office Action, U.S. Appl. No. 16/201,080, filed Nov. 9, 2020, 16 Pages.

\* cited by examiner

METHOD, SYSTEM AND DEVICE FOR MAGNETIC MEMORY

BACKGROUND

1. Field

Disclosed are techniques for forming and operating magnetic memory devices.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

One type of non-volatile memory, electrically erasable programmable read-only memory (EEPROM) devices have large cell areas and may require a large voltage (e.g., from 12.0 to 21.0 volts) on a transistor gate to write or erase. Also, an erase or write time is typically of the order of tens of microseconds. One limiting factor with EEPROMs is the limited number of erase/write cycles to no more than slightly over 600,000—or of the order of $10^5$-$10^6$. The semiconductor industry has eliminated a need of a pass-gate switch transistor between EEPROMs and non-volatile transistors by sectorizing a memory array in such a way that "pages" (e.g., sub-arrays) may be erased at a time in EEPROMs called flash memory devices. In flash memory devices, an ability to keep random access (erase/write single bits) was sacrificed for speed and higher bit density.

More recently, FeRAMs (Ferroelectric RAMs) have provided low power, relatively high write/read speed, and endurance for read/write cycles exceeding 10 billion times. In some situations, this technology may not achieve the density of flash memory devices, for example. As such, flash often remains a non-volatile memory of choice. Nevertheless, it is generally recognized that flash memory technology may not scale easily below 65 nanometers (nm); thus, new non-volatile memory devices capable of being scaled to smaller sizes are actively being sought.

Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. Typical materials vary and may include GeSbTe, where Sb and Te can be exchanged with other elements of the same or similar properties on the Periodic Table. However, these resistance-based memories have not proved to be commercially useful because their transition between the conductive and the insulating state depends on a physical structure phenomenon (e.g., melting at up to 600 degrees C.) and returning to a solid state that cannot be sufficiently controlled for a useful memory in many applications.

Another variable resistance memory category includes materials that respond to an initial high "forming" voltage and current to activate a variable resistance function. These materials may include, for example, $Pr_xCa_yMn_zO_\epsilon$, with x, y, z and $\epsilon$ of varying stoichiometry; transition metal oxides, such as CuO, CoO, VON, NiO, $TiO_2$, $Ta_2O_5$; and some perovskites, such as Cr; $SrTiO_3$. Several of these memory types exist and fall into the resistive RAMs (ReRAMs) or conductive bridge RAMS (CBRAM) classification, to distinguish them from the chalcogenide type memories. It is postulated that resistance switching in these RAMs is due, at least in part, to the formation of narrow conducting paths or filaments connecting the top and bottom conductive terminals by the electroforming process, though the presence of such conducting filaments is still a matter of controversy. Since operation of a ReRAM/CBRAM may be strongly temperature dependent, a resistive switching mechanism in a ReRAM/CBRAM may also be highly temperature dependent. Additionally, these systems may operate stochastically as the formation and movement of the filament is stochastic. Other types of ReRAM/CBRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
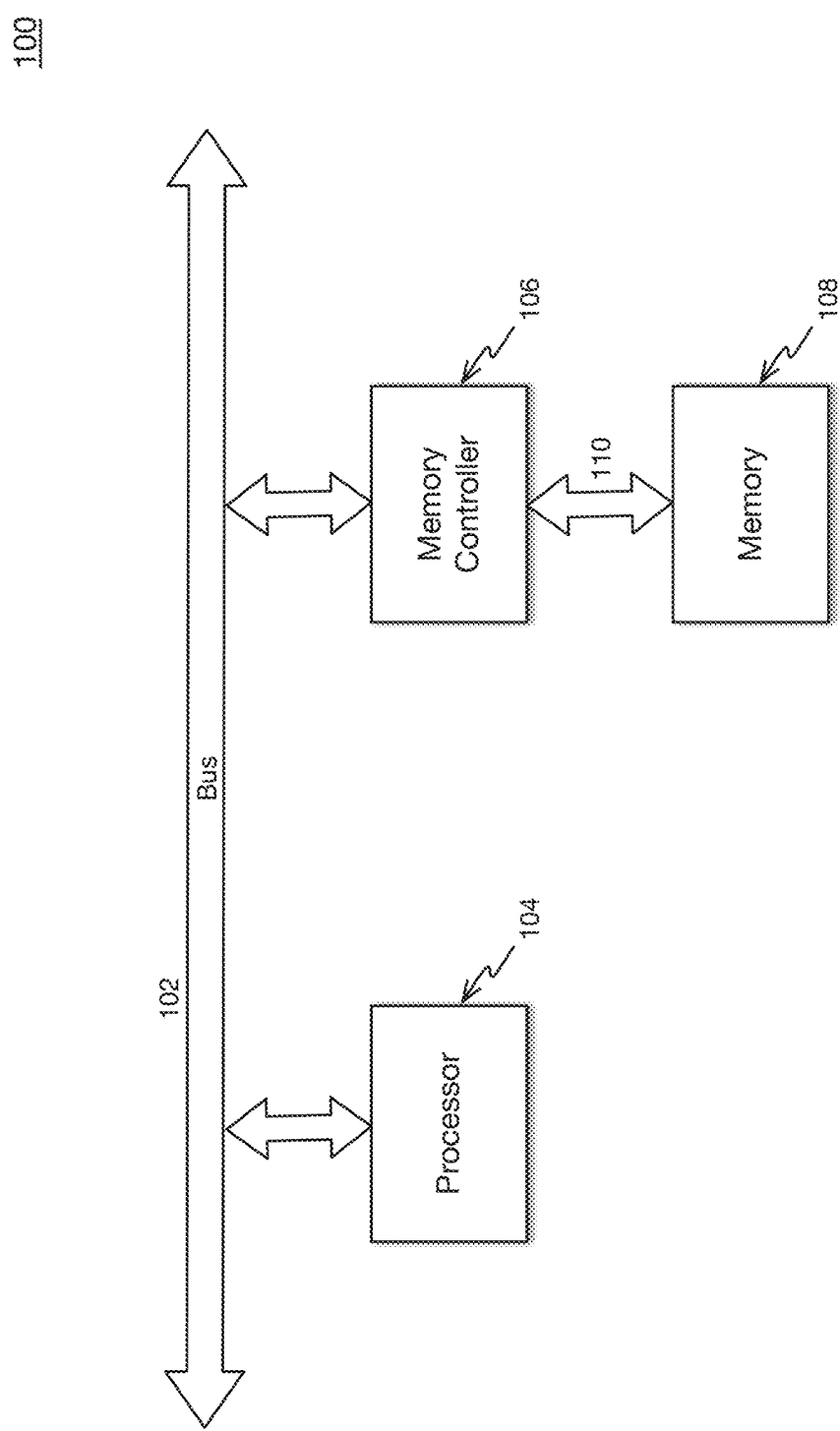
FIG. 1 is a schematic diagram of a computing device according to an embodiment.

Reference is made in the following detailed description to accompanying drawings, which form a part hereof, wherein like numerals may designate like parts throughout that are identical, similar and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

As mentioned, in light of some of the disadvantages associated with various non-volatile memory technologies, new non-volatile memory devices are actively being sought. According to an embodiment, a computing device may incorporate volatile memory systems and/or non-volatile memory systems to perform computing operations. In particular implementations, a memory device may comprise a "volatile" memory device that may maintain a particular memory state while power is applied to the volatile memory device, but may lose the particular memory state if power is removed. In other particular implementations, a memory device may comprise a "non-volatile" memory that may maintain one or more particular memory states for at least a period of time even after power is removed from the memory device. In some implementations, non-volatile memory devices may be designed to maintain particular memory states for periods of time ranging from of a few weeks to several years (e.g., 10 years). However, claimed subject matter is not limited in scope in these respects.

A volatile memory system and/or non-volatile memory system may maintain memory states to represent values, symbols, parameters and/or conditions as memory states such as "bit-cells." In this context, a "bit-cell" or "bit-cell circuit" as referred to herein comprises a circuit or portion of a circuit capable of representing one or more values, symbols or parameters as one or more states. For example, a bit-cell may comprise one or more memory devices that are capable of representing one or more values, symbols or parameters as one or more memory states of the one or more memory devices. In particular implementations, a volatile memory device may be made up of "volatile memory" bit-cells that may lose a detectable memory state after power is removed from the volatile memory bit-cells. Likewise, a non-volatile memory device may be made up of "non-volatile memory" bit-cells capable of maintaining one or more detectable memory states after power is removed from the non-volatile memory bit-cells.

According to an embodiment, a computing device may include non-volatile memory devices. In particular implementations, a non-volatile memory device may include bit-cells comprising one or more magnetic memory devices. Further, in particular implementations, a non-volatile memory bit-cell may include one or more three-terminal, dual-storage magnetic memory devices configured to store pairs of signals and/or states, as discussed more fully below. In other particular implementations, a non-volatile memory bit-cell may include one or more three-terminal, dual-storage magnetic memory devices configured to concurrently store two individual signals and/or states, as also discussed more fully below.

FIG. 1 is a schematic diagram of a computing device 100 according to an embodiment. A processor, such as processor/controller 104, may execute processes or procedures (e.g., under control of computer-readable instructions) to perform various tasks including, for example, storing values in or reading values from addressable portions of a memory, such as memory 108. In a particular implementation, processor/controller 104 may communicate with a memory controller, such as memory controller 106, through a bus, such as bus 102, according to a predefined interface. Processor/controller 104 may provide commands (e.g., specifying a physical memory address) to memory controller 106 to write values to or read values from an addressable portion of memory 108, in an embodiment.

Memory 108 may comprise one or more non-volatile memory devices including, for example, a memory array comprising non-volatile memory bit-cells as described herein. Processor/controller 104, memory controller 106 and/or memory 108 may be formed as separate components or integrated together in a system-on-a-chip (SoC) along with other components not shown (e.g., sensors, user interface, I/O devices). Furthermore, processor/controller 104, memory controller 106 and/or memory array 108 may be formed from any one of several different process technologies. For example, in particular implementations, memory 108 may be formed from magnetic memory processes discussed herein to form non-volatile memory bit-cells, for example.

In embodiments, non-volatile memory technologies, such as example magnetic memory technologies described herein, may be implemented at any level of a memory hierarchy. For example, magnetic memory technologies, such as example embodiments described herein, may be utilized to implement registers and/or caches within a processor, such as processor 104, for example, and/or may be utilized to implement main system storage, such as memory 108, for example. In other embodiments, magnetic memory technologies, such as example embodiments described herein, may be utilized to implement online secondary mass storage systems and/or devices and/or to implement offline tertiary bulk storage systems and/or devices, for example. Of course, claimed subject matter is not limited in scope in these respects.

In a particular implementation, an integrated circuit device, such as processor 104, memory controller 106, and/or memory 108, may be formed according to a digital circuit design within a single register transfer level (RTL) boundary defining a synchronous digital circuit (e.g., in terms of the flow of digital signals between or among registers and operations performed on such digital signals). In a particular implementation, a digital circuit design within a single RTL boundary may be defined according to a hardware description language (HDL) such as, for example, Verilog or VHDL, based on high-level representations of a circuit.

In a particular implementation, computing device 100 may further comprise at least one memory signal bus 110 configurable to transfer signals to memory 108 in write operations and to transfer stored values obtained from memory 108 in read operations. In this context, a "read operation" as referred to herein refers to an operation implemented by a circuit to detect one or more memory states of one or more bit-cells. Further in this context, a "write operation" as referred to herein refers to an operation implemented by a circuit to place one or more bit-cells in one or more particular memory states. For example, a write operation may comprise generation of one or more "programming signals" having particular properties (e.g., a voltage and/or current) which may be applied, with particular timing properties, for example, to one or more portions of a bit-cell to place the bit-cell in one or more particular memory states (e.g., a memory state that is detectable in a subsequent read operation).

Figure 2:
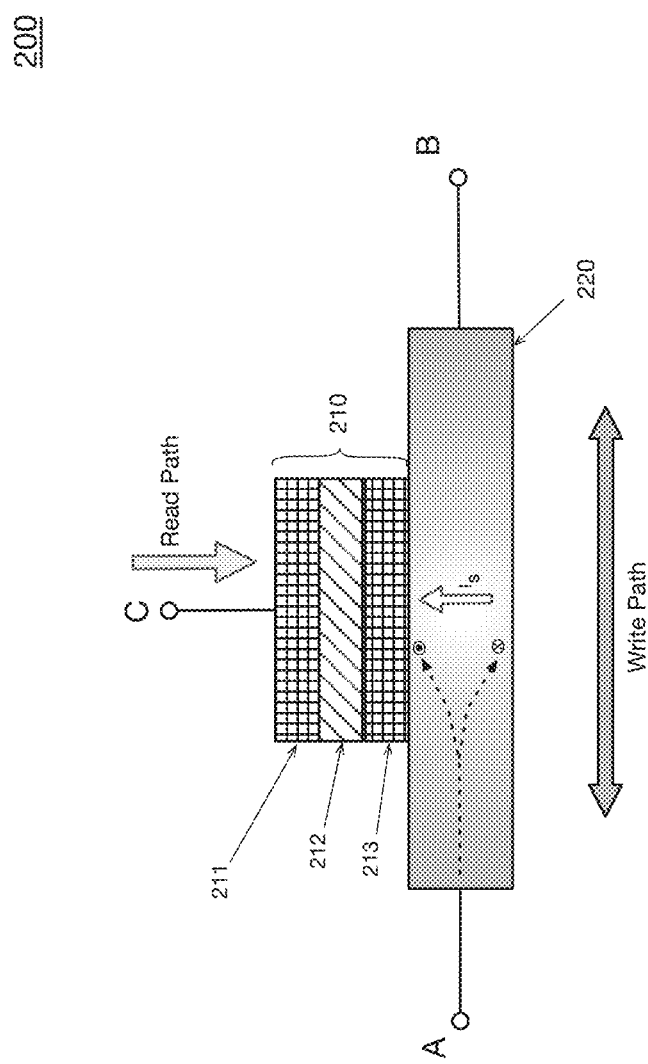
FIG. 2 depicts an illustration of a cross-sectional view of an example three-terminal single-storage non-volatile magnetic memory device, in accordance with an embodiment.

FIG. 2 depicts a cross-sectional illustration of an embodiment 200 of an example three-terminal, single-storage non-volatile magnetic memory device. In the context of the present patent application, "terminal" and/or the like refers to an electrically conductive element of a device, for example, that may be electrically connected and/or connectable to an electrically conductive line to enable electrical conductivity between the device and the electrically conductive line. In a particular implementation, magnetic memory device 200, for example, may be referred to as a "three-terminal" magnetic memory device. In the context of the present implementation, a "three-terminal" device and/or the like refers to a device comprising at least three terminals. Also, in the context of the present implementation, a "single-storage" memory device and/or the like refers to a memory device having a characteristic of storing a single signal and/or state indicative of a single value at any particular point in time. Similarly, as discussed more fully below, a "dual-storage" memory device and/or the like refers to a memory device having a characteristic of storing two signals and/or states. In an embodiment, a complementary pair of signals and/or states may be indicative of a single particular value at a given point in time, as explained more fully below. In another embodiment, a pair of signals and/or states may be indicative of two particular values at given point in time, as also explained more fully below. Example memory device 200, in a particular implementation, may comprise a three-terminal, single-storage non-volatile memory device.

In an embodiment, a non-volatile magnetic memory device, such as non-volatile magnetic memory device 200, may comprise, for example, a Spin-Orbit-Torque Magnetic Tunnel Junction (SOT-MTJ) memory device. For example, SOT-MTJ memory device 200 may comprise a Spin-Hall-Effect (SHE)-MTJ memory element, for example, including a metal layer, such as SOT metal layer 220, and/or may further include a magnetic tunnel junction (MTJ) stack 210. In an embodiment, SOT metal layer 220 may comprise, for example, tantalum (Ta), platinum (Pt), or antiferromagnetic metal alloys like IrMn, PtMn or combinations thereof, etc. Of course, SOT metal layer 220 is not limited in scope to particular metals.

Also, in an embodiment, MTJ component 210 may include one or more layers, such as layers 211, 212, and/or 213, comprising one or more layers of magnetic material, such as layers 211 and/or 213. In an embodiment, layers 213 and/or 211 may comprise CoFeB, for example. Also, in an embodiment, layer 212 may comprise $Al_2O_3$, MgO, BFO, for example. However, claimed subject matter is not limited in scope to the particular materials mentioned for MTJ component 210. Further, MTJ stack 210, for example, may include any number and/or type of layers. In an embodiment, a layer, such as layer 211, may comprise a "pinned" magnetic layer (e.g., magnetization vector is fixed in a particular orientation). Further, in an embodiment, a layer, such as layer 213, may comprise a magnetic "free" layer (e.g., magnetization vector orientation may be switched to match the orientation of an external field). Other layers may include, for example, one or more Synthetic Antiferromagnetic (SAF) layers. In an embodiment, one or more SAF layers may help to keep a magnetization of a 'pinned' layer fixed in a particular orientation. In particular implementations, one or more fine-tuning layers, such as one or more dual oxide layers within a MTJ stack, may be utilized. In an embodiment, orientation of a magnetization vector within magnetic free layer 213 may depend at least in part on a direction of a current to have flowed through SOT metal layer 220. For example, for a current flowing through SOT metal layer 220 in a first direction, such as from terminal A to terminal B, the magnetization vector of magnetic free layer 213 may be oriented in a first direction. Also, for example, for a current flowing through SOT metal layer 220 in a second direction, such as from terminal B to terminal A, the magnetization vector of magnetic free layer 213 may be oriented in a second direction.

In an embodiment, magnetization vectors within pinned magnetic layer 211 and/or magnetic free layer 213 may be made to be oriented in the same direction or may be made to be oriented in an opposite direction depending on the direction of a current to have flowed through SOT metal layer 220. In an embodiment, if the orientation of the magnetization vectors within magnetic free layer 213 and pinned magnetic layer 211 are substantially the same, then MTJ stack 210 may exhibit a characteristic of a relatively lower resistance. Similarly, in an embodiment, if the orientation of the magnetization vectors within magnetic free layer 213 and pinned magnetic layer 211 are substantially opposite, then MTJ stack 210 may exhibit a characteristic of a relatively higher resistance. In an embodiment, a current flow from terminal A to terminal B may result in a lower resistance within MTJ stack 210, for example. Further, in an embodiment, a current flow from terminal B to terminal A may result in a higher resistance within MTJ stack 210, for example. In this manner, for example, a data value (e.g., signal and/or state) may be written to non-volatile magnetic memory element 200. Of course, claimed subject matter is not limited in scope to these particular examples.

Additionally, in an embodiment, a data value (e.g., signal and/or state) may be read from non-volatile magnetic memory element 200 by sensing a resistance state of MTJ component 210. For example, a current flow between terminal C and terminal A may be sensed to determine whether MTJ component 210 is in a relatively higher resistance state or in a relatively lower resistance state. Similarly, a voltage level at terminal A and/or C, for example, may be sensed to determine a particular resistive state of MTJ component 210.

In an embodiment, current flow through a metal layer, such as SOT metal layer 220, may result in spin-splitting due to spin orbit torque (e.g., spin hall effect and/or Rashba effect). For example, when an electric current is passed through an SOT/SHE layer, such as SOT metal layer 220, an electron current comprising up and down spin splits into two different currents, such as, for example, an Up spin current and a Down spin current. Up and Down spin currents are illustrated in a simplified way in FIG. 2 within SOT metal layer 220. In a particular implementation, spin current generated by passing current through SOT metal layer 220, for example, may be utilized to affect a magnetization vector orientation with in magnetic free layer 213, for example, at least in part due to the physical contact of magnetic free layer 213 and SOT metal layer 220.

Figure 3:
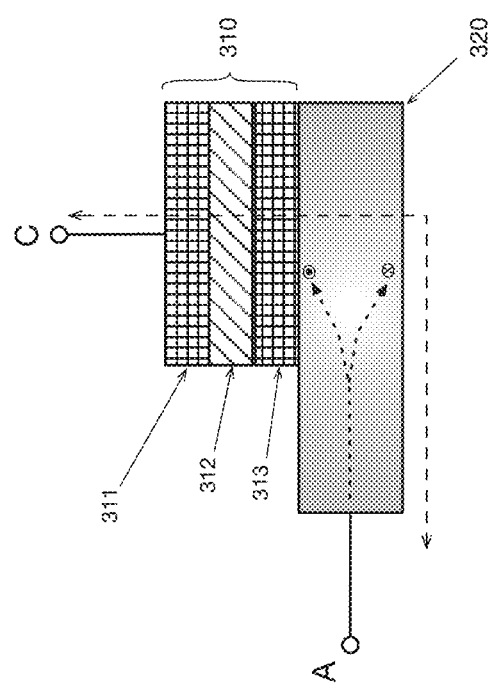
FIG. 3 depicts an illustration of a cross-sectional view of an example two-terminal single-storage non-volatile magnetic memory device, in accordance with an embodiment.

In some circumstances, three-terminal, single-storage magnetic memory devices, such as magnetic memory device 200, may be utilized to implement bit-cells in non-volatile memory devices, such as memory device 108 and/or to implement registers and/or caches in a processor, such as processor 104, for example. However, efforts to reduce the count of switching and/or isolating devices, such as transistors, for example, in particular bit-cell implementations have led to development of two-terminal, single-storage magnetic devices. FIG. 3, for example, depicts a cross-sectional illustration of an embodiment 300 of an example two-terminal, single-storage non-volatile magnetic memory device.

In a particular implementation, magnetic memory device 300 may include an MTJ component 310, similar in at least many respects to MTJ component 210 discussed above. For example, MTJ component 310 may include one or more pinned magnetic layers 311, one or more layers 312, and/or one or more free magnetic layers 313. Further, in a particular implementation, MTJ component 310 may be formed substantially adjacent to an SOT metal layer, such as SOT metal layer 320. For example, free magnetic layer 313 may be formed to be in physical contact with SOT layer 320. Although current flow through magnetic memory device 300 may be restricted to a path between terminals A and C (e.g., due to a lack a second terminal for SOT layer 320), an electron spin-splitting occurs within SOT metal layer 320, for example, and a magnetization vector orientation within free magnetic layer 313 may still be affected due to the resulting spin currents. Thus, in a particular implementation, a two-terminal magnetic memory device, such as example device 300, may be utilized within non-volatile bit-cell circuits to store signals and/or states representative of single values.

Because a two-terminal single-storage magnetic memory device may be implemented within a bit-cell circuit using fewer transistors, for example, as compared with implementations utilizing three-terminal single-storage magnetic memory devices, bit-cells may be implemented using smaller amounts of integrated circuit die area and/or an increase in device density within non-volatile memory devices may be achieved. However, there is an increasing need for even greater device densities, for example, in non-volatile memory devices. Also, the three-terminal and/or two-terminal single-storage magnetic memory devices discussed above may exhibit characteristics resulting in small and/or degraded read margins due at least in part to single-sided sensing of resistive states of MTJ components in single-storage magnetic memory devices, for example. To address at least some of the potentially problematic issues related to two and/or three-terminal single-storage magnetic memory devices and/or to increase efficiencies in die area utilization, for example, three-terminal dual-storage magnetic memory devices may be implemented in example embodiments, as discussed more fully below.

Figure 4:
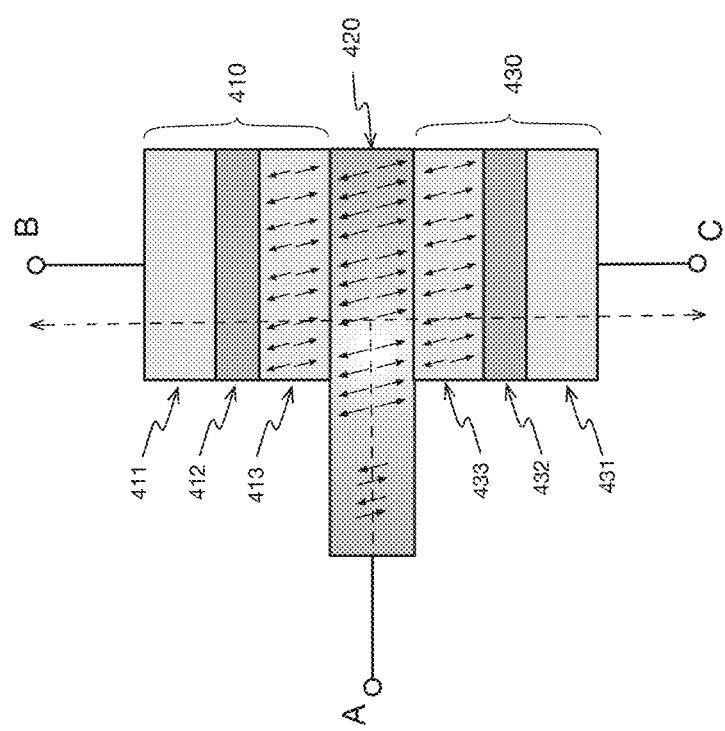
FIG. 4 depicts an illustration of a cross-sectional view of an example three-terminal dual-storage non-volatile magnetic memory device, in accordance with an embodiment.

FIG. 4 depicts a cross-sectional illustration of an embodiment 400 of an example three-terminal, dual-storage non-volatile magnetic memory device. In a particular implementation, magnetic memory device 400 may include MTJ components 410 and 430. In an embodiment, MTJ components 410 and/or 430 may be similar in at least some respects to MTJ component 210 discussed above. For example, MTJ component 410 may include one or more pinned magnetic layers 411, one or more layers 412, and/or one or more free magnetic layers 413. Similarly, MTJ component 430 may include one or more pinned magnetic layers 431, one or more layers 432, and/or one or more free magnetic layers 433. Further, in a particular implementation, MTJ component 410 may be formed substantially adjacent to a particular surface of an SOT metal layer, such as SOT metal layer 420. For example, free magnetic layer 413 may be formed to be in physical contact with SOT layer 420. Also, in a particular implementation, MTJ component 430 may be formed substantially adjacent to a different particular surface of SOT metal layer 420. For example, free magnetic layer 433 may be formed to be in physical contact with SOT layer 420. In an embodiment, MTJ components 410 and 430 may be formed on opposing surfaces of SOT metal layer 420, although claimed subject matter is not limited in scope in these respects.

In a particular implementation, current flow through magnetic memory device 400 may be restricted to paths between terminals A and C and/or A and B (e.g., due to lack of a second terminal for SOT layer 420). Electron spin-splitting occurs within SOT metal layer 420, in a manner discussed above in connection with magnetic memory device 300. For example, a magnetization vector orientation within free magnetic layers 413 and/or 433 may still be affected due to the resulting spin currents as current flows between terminals A and B and/or between terminals A and C.

In an embodiment, spin-splitting within SOT metal layer 420 resulting from current flow between terminals A and B and/or between terminals A and C may result in a magnetic orientation of magnetic free layer 413 being affected in a manner opposite to that of a magnetic orientation of magnetic free layer 433, for example. That is, for a given current through SOT metal layer 420, free magnetic layers 413 and 433 will be flipped to opposing magnetization vector orientations. In this manner, a current through SOT layer 420 in a first direction (e.g., from terminal A to terminals B and C) may result in MTJ component 410 exhibiting a higher resistance state and in MTJ component 430 exhibiting a lower resistance state. Similarly, a current through SOT layer 420 in a second direction (e.g., from terminals B and C to terminal A) may result in MTJ component 410 exhibiting a lower resistance state and in MTJ component 430 exhibiting a higher resistance state. Thus, in an embodiment, a write operation to three-terminal magnetic memory device 400 may store a complementary pair of signals and/or states (e.g., with a first MJT component to exhibit a high resistance state and a second MJT component to exhibit a low resistance state) to represent or map to a single value (e.g., a "1" or "0").

Additionally, in an embodiment, signals and/or states may be read from non-volatile magnetic memory element 400 by sensing resistance states of MTJ components 410 and/or 430. For example, a current flow between terminal A and B may be sensed to determine whether MTJ component 410 is in a relatively higher resistance state (e.g., value "0") or in a relatively lower resistance state (e.g., value "1"). Similarly, a current flow between terminals A and C may be sensed to determine whether MTJ component 430 stores a "1" (e.g., lower resistance state) or "0" (e.g., higher resistance state). Because of the availability of two separate currents to sense, differential sensing may be implemented. Differential sensing may increase read margins such that performance and/or reliability of bit-cell circuits may be improved.

Figure 5:
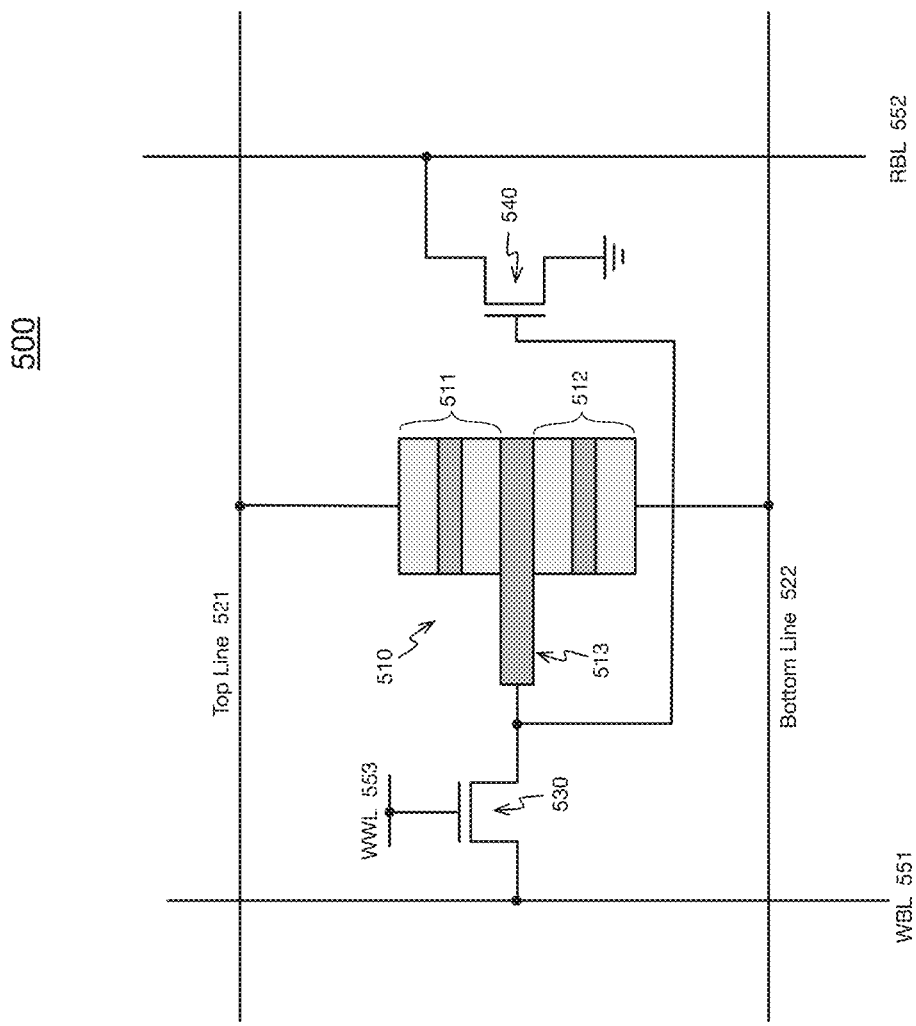
FIG. 5 is a schematic diagram depicting an example bit-cell including an example three-terminal dual-storage non-volatile magnetic memory device, in accordance with an embodiment.
Figure 6:
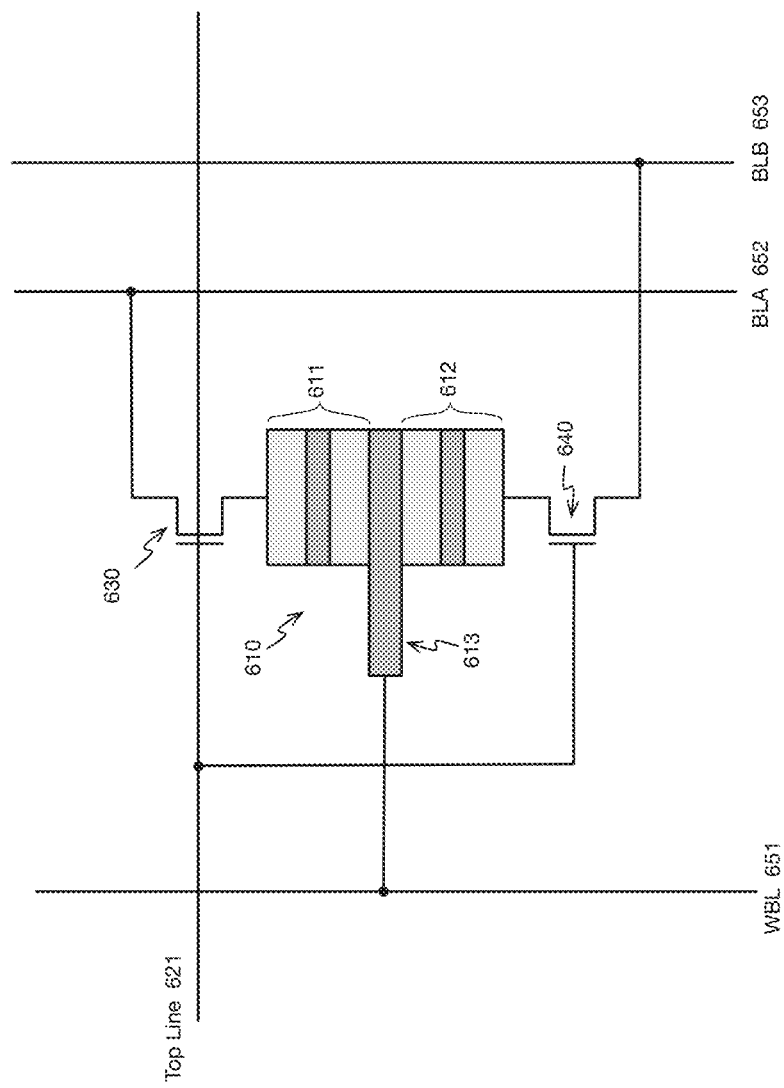
FIG. 6 is a schematic diagram depicting an example bit-cell including an example three-terminal dual-storage non-volatile magnetic memory device, in accordance with an embodiment.
Figure 7:
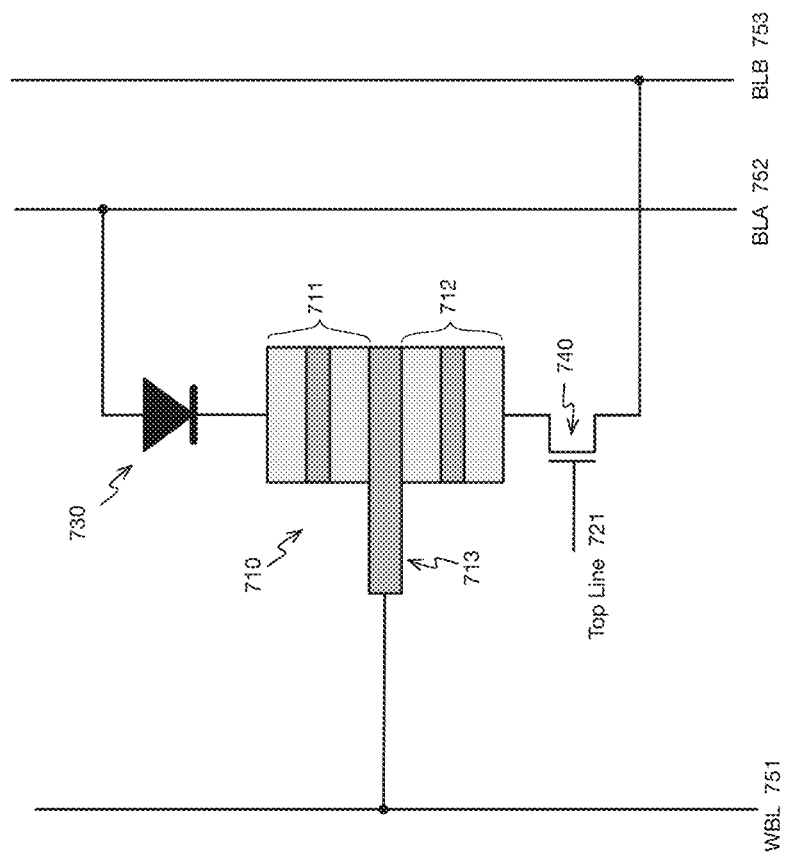
FIG. 7 is a schematic diagram depicting an example bit-cell including an example three-terminal dual-storage non-volatile magnetic memory device, in accordance with an embodiment.

FIGS. 5-7, discussed below, depict example bit-cell circuits implementing example embodiments of three-terminal dual-storage magnetic memory devices. At FIG. 5, a schematic block diagram depicts an embodiment 500 of an example bit-cell including an example three-terminal dual-storage non-volatile magnetic memory device, such as magnetic memory device 510, in accordance with an embodiment. In an embodiment, a bit-cell, such as bit-cell 500, may include a three-terminal dual-storage magnetic memory device, such as memory device 510. In a particular implementation, magnetic memory device 510 may include a first MTJ component 511 and a second MTJ component 512. In an embodiment, MTJ components 511 and 512 may abut different surfaces (e.g., opposing surfaces) of a metal layer, such as SOT metal layer 513.

To perform a write operation to magnetic memory device 510, a word-line, such as WWL 553, may be asserted, thereby enabling a switching device, such as transistor 530, and thereby electrically coupling a bit-line, such as WBL 551, to metal layer 513. In an embodiment, WBL 551 may be pulled to a logically high voltage level. Also, signal lines, such as top line 521 and bottom line 522, may be pulled to a logically low voltage level (e.g., a common source voltage level). As a result of a logically high voltage level being applied to metal layer 513 and a logically low voltage level applied to top line 521 and bottom line 522, current may flow from WBL 551 through metal layer 513 and through MTJ components 511 and 512. In a particular implementation, a logically high voltage level may have a magnitude in a range of approximately 0.4V to 1.0V, although claimed subject matter is not limited in scope in this respect. A logically low voltage level may have a magnitude of approximately 0.0V, for example, although, again, claimed subject matter is not limited in scope in this respect.

As indicated previously, a current flowing through a metal layer in a three-terminal dual-storage magnetic memory device, such as example devices 400 and 500, for example, free magnetic layers in MTJ components 511 and 512 may be flipped to opposing magnetization vector orientations. Thus, for example, MTJ component 511 may be placed in a first particular resistance state and MTJ component 512 may be placed in a second particular resistance state. In an embodiment, MTJ components 511 and 512 may be placed in complementary resistance states representative of a single value. For example, as a result of the write operation, depending on a direction of current flow through metal layer 513, MTJ component 511 may exhibit a high resistance state and MTJ component 512 may exhibit a low resistance state to collectively represent or map to a value of "1", or MTJ component 511 may exhibit a low resistance state and MTJ component 512 may exhibit a high resistance state to collectively represent or map to a value of "0".

As described above, to write a particular pair of complementary signals and/or states to magnetic memory device 510, current may be made to flow through metal layer 513 in a first direction by pulling WBL 551 to a logically high voltage level and by placing top and bottom lines 521 and 522 at a logically low voltage level. In an embodiment, performing a write operation to store a different complementary pair of signals and/or states to magnetic memory device 510, WBL 551 may be placed at a logically low voltage level and a logically high voltage level may be applied to top and bottom lines 521 and 522. In an embodiment, control circuitry (not depicted) may manage application of appropriate voltage levels to WBL 551 and top and bottom lines 521 and 522 and to WWL 553 to perform write operations.

Further, in a particular implementation, to perform a read operation, a voltage and/or current level of a bit-line, such as RBL 552, may be sensed, such as by sense circuitry (not depicted). For example, a current and/or voltage level on RBL 552 may depend, at least in part, on a voltage level applied to a switching device, such as transistor 540. For example, a gate terminal of transistor 540 may be electrically connected to metal layer 513, and a voltage occurring at metal layer 513 may determine how much current is allowed to flow through transistor 540, thereby affecting a voltage and/or current level on RBL 552. In a particular embodiment, a voltage level occurring at metal layer 513 may vary depending on the resistive states of MTJ components 511 and 512. For example, a complementary pair of signals and/or states representing a single value (e.g., a "0" or "1") stored at MTJ components 511 and 512, respectively, may yield a first voltage level (e.g., due to a voltage divider circuit formed between top line 521 and bottom line 522 including MTJ components 511 and 512) at metal layer 513. A complementary pair of states stored at MTJ components 511 and 512, respectively, may yield a second voltage level at metal layer 513. In a particular implementation, the difference between the first and second voltage levels may yield a difference in voltage and/or current levels on RBL 522 that may be sensed by sense circuitry to determine signals and/or states stored at magnetic memory device 510. In a particular implementation, WWL 553 may be placed at a logically low voltage level during sensing operations.

As seen in FIG. 5, example bit-cell 500 may be implemented with two transistors, such as transistors 530 and 540. Thus, two signals and/or states may be stored in a bit-cell utilizing a three-terminal magnetic memory device and two transistors. Such an implementation may provide a reduction in device count, a reduction in write-energy, and/or a reduction in die area utilization as compared with other non-volatile memory bit-cell implementations.

In this context, a "word-line" comprises a conductor for transmitting a signal to select a particular bit-cell or group of bit-cells to be accessed in a read operation or a write operation. In a particular example implementation, a voltage of a signal on a word-line may be raised or lowered to select or deselect a particular bit-cell or group of bit-cells to be connected to a corresponding bit-line or group of bit-lines during a read or write operation. It should be understood, however, that this is merely an example of a word-line and that claimed subject matter is not limited in this respect. Also, in this context, a "bit-line" comprises a conductor that is connectable to at least a portion of a bit-cell circuit during a write operation to transmit a signal altering one or more memory states of the bit-cell circuit, or during a read operation to transmit a signal representative of one or more memory states of the bit-cell circuit.

Example embodiments implementing non-volatile magnetic memory devices, such as magnetic memory device 510, within a bit-cell, such as bit-cell 500, may be utilized, for example, to implement relatively fast start-up (e.g., instant-on) and/or relatively fast sleep and/or shut-down (e.g., instant-off) in electronic devices, such as Internet of Things (IoT) devices (e.g., cell phones, tablets, notebook computers, wearable devices, etc.). Additionally, for example, non-volatile magnetic memory devices within a bit-cell may also be utilized for predicting branching states and/or for restoring previous processing states, in an embodiment. Such implementations may be utilized, for example, as programmable read-only memories and/or for look-up tables to enable near-memory computing (e.g., processor located in close proximity to memory), in an embodiment. Of course, these are merely examples of how non-volatile magnetic memory devices may be implemented and/or utilized, and claimed subject matter is not limited in scope in these respects.

FIG. 6 is a schematic diagram depicting an embodiment 600 of an example bit-cell including an example three-terminal dual-storage non-volatile magnetic memory device, such as magnetic memory device 610. In an embodiment, a bit-cell, such as bit-cell 600, may include a three-terminal dual-storage magnetic memory device, such as memory device 610. In a particular implementation, magnetic memory device 610 may include a first MTJ component 611 and a second MTJ component 612. In an embodiment, MTJ components 611 and 612 may abut different surfaces (e.g., opposing surfaces) of a metal layer, such as SOT metal layer 613.

To perform a write operation to magnetic memory device 610, such as to store complementary signals and/or states in MTJ components 611 and 612, signal lines, such as BLA 652 and BLB 653, may be placed at a logically high voltage level or a logically low voltage level, depending, at least in part, on the particular signals and/or states to be written to memory device 610. In a particular embodiment, for a write operation, BLA 652 and BLB 653 may be placed at approximately the same voltage level. A bit-line, such as WBL 651, may also be placed at a logically high voltage level or a logically low voltage level, depending, at least in part, on particular signals and/or states to be written to memory device 610. A signal line, such as top-line 621, may be asserted to enable transistors 630 and 640, for example, to allow current to flow between WBL 651 and signal lines 652 and 653.

In a particular implementation, to write a first complementary pair of signals and/or states to memory device 610, WBL 651 may be placed at a logically high voltage level, signal lines 652 and 653 may be placed at a logically low voltage level, and top line 621 may be asserted to enable current flow through MTJ components 611 and 612. To write a different complementary pair of signals and/or states to memory device 610, WBL 651 may be placed at a logically low voltage level, signal lines 652 and 653 may be placed at a logically high voltage level, and top line 621 may be asserted, in an embodiment. Also, in a particular implementation, to perform a read operation, WBL 651 may be placed at logically low voltage level, and bit-lines BLA 652 and BLB 653 may be precharged to logically high voltage levels. Also, top-line 621 may be asserted, thereby allowing bit-lines BLA 652 and BLB 653 to discharge through MTJ components 611 and 612, respectively. In an embodiment, the different resistance states of MTJ components 611 and 612 may result in different rates of discharge on bit-lines BLA 652 and BLB 653. The difference in rates of discharge may be sensed by sensing circuitry to determine particular signals and/or states stored in magnetic memory device 610, for example.

In an embodiment, MTJ components 611 and 612, for example, may store individual signals and/or states representative of individual values rather than, for example, storing complementary signals and/or states representative of a particular value. For example, write operations may store signals and/or states in both MTJ component 611 and MTJ component 612 representative of identical values (e.g., '1, 1' or '0, 0' and/or may store signals and/or states in MTJ component 611 and/or MTJ component 612 representative of different values (e.g., '0, 1' or '1, 0'). To perform a write operation to store signals and/or states in both MTJ component 611 and MTJ component 612 representative of identical values (e.g., '1, 1' or '0, 0'), a first operation may store a complementary pair of signals and/or states in MTJ component 611 and MTJ component 612 representative of a complementary pair of values. A second operation may flip a magnetization vector for one of the MTJ components such that both MTJ components are placed in similar resistance states, as explained more fully below.

In an embodiment, to store signals and/or states in both MTJ component 611 and MTJ component 612 representative of identical values (e.g., '1, 1' or '0, 0'), a first operation may place MTJ component 611 in a first resistance state (e.g., a higher resistance state) representative of a first value (e.g., '0') and may place MTJ component 612 in a second resistance state (e.g., lower resistance state) representative of a second value (e.g., '1'). A subsequent operation may flip MTJ component 612 from the second resistance state to the first resistance state while maintaining the resistive state of MTJ 611, resulting in both MTJ component 611 and MTJ component 612 having similar resistance states individually representative of identical values (e.g., '0, 0').

In a particular implementation, MTJ component 611, for example, may change magnetization vector orientation at a magnitude of current greater than that for MTJ component 612. Thus, to flip orientation of a magnetization vector for MTJ 612 while maintaining orientation of a magnetization vector for MTJ 611, for example, a current sufficient to change magnetization vector orientation for MTJ 612 but insufficient to change magnetization vector orientation for MTJ 611 may be caused to flow through metal layer 613. In an embodiment, a magnitude of current to change magnetization vector orientation for a particular MTJ component may be determined, at least in part, by a particular cross-sectional area of a particular MTJ component and/or by a particular arrangement and/or configuration of particular layers within a particular MTJ component. Thus, in a particular implementation, magnetization vector orientation change characteristics for particular MTJ components, such as MTJ components 611 and/or 612, for example, may be specified such that a magnetization vector orientation for a particular MTJ component may be flipped while maintaining a magnetization vector orientation for another particular MTJ component. In a particular implementation, a pair of MTJ components, such as MTJ components 611 and/or 612, for example, may store signals and/or states representative of any combination of binary values (e.g., '0, 0', '0, 1', '1, 0', or '1, 1').

FIG. 7 is a schematic diagram depicting an embodiment 700 of an example bit-cell including an example three-terminal dual-storage non-volatile magnetic memory device, such as magnetic memory device 710. In an embodiment, a bit-cell, such as bit-cell 700, may include a three-terminal dual-storage magnetic memory device, such as memory device 710. In a particular implementation, magnetic memory device 710 may include a first MTJ component 711 and a second MTJ component 712. In an embodiment, MTJ components 711 and 712 may abut difference surfaces (e.g., opposing surfaces) of a metal layer, such as SOT metal layer 713.

In a particular implementation, example bit-cell 700 may exhibit many characteristics of example bit-cell 600, discussed above. However, example bit-cell 700 replaces transistor 630 with a diode, such as diode 730. Utilization of a diode in place of a transistor may enable implementation with smaller integrated circuit die area, for example. In a particular implementation, diode 730 may be formed at part of a back-end-of line process, for example.

To perform a write operation to magnetic memory device 710, such as to store a complementary pair of signals and/or states in MTJ components 711 and 712, signal lines, such as BLA 752 and BLB 753, may be placed at a logically high voltage level or a logically low voltage level, depending, at least in part, on the values to be written to memory device 710. In a particular embodiment, for a write operation, BLA 752 and BLB 753 may be placed at approximately the same voltage level, although claimed subject matter is not limited in scope in this respect. A bit-line, such as WBL 751, may also be placed at a logically high voltage level or a logically low voltage level, depending, at least in part, on the values to be written to memory device 710. A signal line, such as top-line 721, may be asserted to enable transistor 740, for example, to allow current to flow between WBL 751 and BLB 753. Of course, current may flow through diode 730 in only a single direction, under normal operating conditions. For example, current may flow from BLA 752 through MTJ component 711 to metal layer 713, but may not flow in the opposite direction. This might at first appear to undermine the goal of writing particular signals and/or states to MTJ 711. However, as a result of current flowing from WBL 751 to BLA 753 through metal layer 713, spin-splitting may still occur within metal layer 713, and a magnetic orientation of a free magnetic layer of MTJ 711 may be affected according to the direction of current flow through metal layer 713, as explained above.

In a particular implementation, to write a first complementary pair of signals and/or states to memory device 710, WBL 751 may be placed at a logically high voltage level, signal line 752 may be placed at a logically low voltage level (BLB 753 perhaps as well, although current may not flow through diode 730 in this circumstance), and top line 721 may be asserted to enable current flow through MTJ component 712. As mentioned, even though current may not flow through MTJ component 711 due to the presence and orientation of diode 730, the current flowing through metal layer 713 as a result of the particular voltage levels on WLB 751 and BLA 753 may still result in spin-splitting, and MTJ 711 may be placed in an appropriate resistance state. Further, in a particular implementation, to write a different complementary pair of signals and/or states to memory device 710, WBL 751 may be placed at a logically low voltage level, BLA 752 and BLA 753 may be placed at logically high voltage levels, and top line 721 may be asserted, in an embodiment. Further, the presence and/or orientation of diode 730 may not affect read operations (e.g., current flow in a particular embodiment is from BLA 752 through MTJ component 711 to metal layer 713), so read operations may occur in a manner similar to that described above in connection with example bit-cell 600.

Although embodiments herein may be described with reference to particular data values corresponding to particular logical voltage levels and/or particular resistance states, for example, claimed subject matter is not limited in scope in these respects. Other embodiments may be implemented using other conventions with respect to data values, logical voltage levels, resistance states, etc. Further, although signals may be described herein as being asserted to a logically higher voltage level, other embodiments may include signals that may be asserted by pulling the signal to a lower and/or negative voltage level, for example. Similarly, although switch components, such as transistors, are described and/or depicted as being enabled by a logically high voltage signal, other switching devices may be utilized that may be enabled by logically low voltage signals and/or negative voltage signals, for example.

Further, as described in particular implementations within, a voltage signal having a voltage level for a programming signal to place a memory device in a predetermined memory state may be selected at a signal selection circuit based, at least in part, on a data signal. Conducting elements connected to the signal selection circuit may selectively connect the voltage signal to or disconnect the voltage signal from the memory device at a current level corresponding to the predetermined memory state based, at least in part, on the data signal. In this context, a "conducting element" comprises a circuit element capable of permitting current to pass between two nodes. In a particular implementation, a conducting element may vary a current permitted to pass between nodes based, at least in part, on a particular condition. Particular implementations described herein may employ n-type field effect transistors (NFET) as conducting elements to permit current to pass between source and drain terminals based, at least in part, on a voltage applied to a gate terminal. Other particular implementations may employ p-type field effect transistors (PFET), or a combination of NFETs and/or PFETs, for example. It should be understood, however, that other types of devices such as a bipolar transistor, diode, variable resistor, etc. may be used as a conducting element, and that claimed subject matter is not limited in this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

Figure 8:
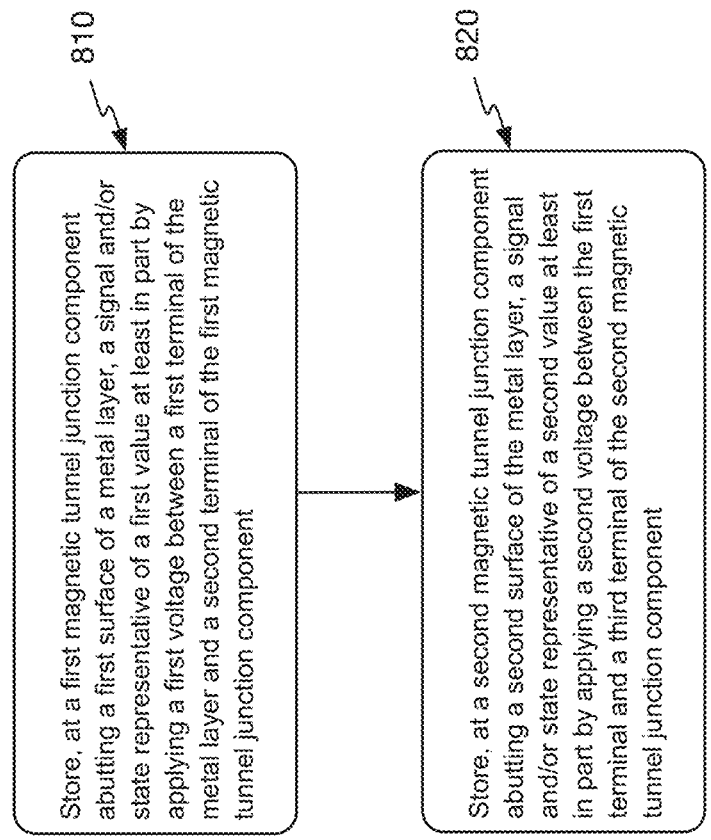
FIG. 8 is an illustration of an example simplified flow diagram depicting an example process for writing a pair of signals and/or states to an example three-terminal dual-storage non-volatile magnetic memory device, in accordance with an embodiment.

FIG. 8 is an illustration of an example simplified flow diagram depicting an example process for writing signals and/or states to an example three-terminal dual-storage non-volatile magnetic memory device, such as magnetic memory devices 500 and/or 600, for example, in accordance with an embodiment. Embodiments in accordance with claimed subject matter may include all of blocks 810-820, fewer than blocks 810-820, or more than blocks 810-820. Further, the order of blocks 810-820 is merely an example order, and claimed subject matter is not limited in scope in these respects.

As depicted at block 810, a first MTJ component, such as MTJ components 511, 611, and/or 711, for example, may abut a first surface of a metal layer. The metal layer, such as SOT metal layers 513, 613, and/or 713, for example, may comprise first terminal and the first MTJ component may comprise a second terminal. A second MTJ component, such as MTJ components 512, 612, and/or 712, may abut a second surface of the metal layer and may include a third terminal. An example process may include storing a signal and/or state representative of a first value at the first MTJ component at least in part by applying a first voltage between the first terminal and the second terminal. For example, as explained above in connection with example bit-cell 500, a word-line, such as WWL 553, may be asserted, thereby enabling a switching device, such as transistor 530, and thereby electrically coupling a bit-line, such as WBL 551, to metal layer 513. In an embodiment, WBL 551 may be pulled to a logically high voltage level. Also, a signal line, such as top line 521, may be pulled to a logically low voltage level (e.g., a common source voltage level). As a result of a logically high voltage level being applied to metal layer 513 and a logically low voltage level applied to top line 521, current may flow from WBL 551 through metal layer 513 and through MTJ component 511, thus setting a particular resistance state of MTJ 511 in accordance with a specified value.

Additionally, as depicted at block 820, storing a signal and/or state representative of a second value at the second MTJ component, such as MTJ components 512, 612, and/or 712, may include applying a second voltage between the first terminal and the third terminal. For example, a word-line, such as WWL 553, may be asserted, thereby enabling a switching device, such as transistor 540, and thereby electrically coupling a bit-line, such as WBL 551, to metal layer 513. In an embodiment, WBL 551 may be pulled to a logically high voltage level. Also, a signal line, such as bottom line 522, may be pulled to a logically low voltage level (e.g., a common source voltage level). As a result of a logically high voltage level being applied to metal layer 513 and a logically low voltage level applied to bottom line 522, current will flow from WBL 551 through metal layer 513 and through MTJ component 512, thus setting a particular resistance state of MTJ 512 in accordance with a specified value, for example. In embodiments, operations to store the signals and/or states in first and/or second MTJ components, such as described above in connection with blocks 810 and/or 820, for example, may be performed in any order and/or may be performed concurrently.

In general, embodiments disclosed herein may include bit-cell circuit, comprising one or more non-volatile magnetic memory elements individually comprising a first magnetic tunnel junction component including a first terminal, the first magnetic tunnel junction component abutting a first surface of a metal layer, and a second magnetic tunnel junction component including a second terminal, the second magnetic tunnel junction component abutting a second surface of the metal layer, wherein the metal layer includes a third terminal. In an embodiment, the first magnetic tunnel junction component may store a first signal and/or state responsive to a voltage applied between the third terminal and the first terminal, and wherein the second magnetic tunnel junction component to store a second signal and/or state responsive to a voltage applied between the third terminal and the second terminal.

In an embodiment, a first MTJ component may comprise one or more free magnetic layers and one or more pinned magnetic layers, wherein at least one of the one or more free magnetic layers is positioned substantially adjacent to the first surface of the metal layer. A second MTJ component may include one or more free magnetic layers and one or more pinned magnetic layers, wherein at least one of the one or more free magnetic layers is positioned substantially adjacent to the second surface of the metal layer. Further, in a particular implementation, a metal layer of a non-volatile magnetic memory device may comprise a spin-orbit-torque (SOT) metal layer.

In a particular implementation, a bit-cell circuit may further include a circuit to apply a voltage between the third terminal and the first terminal at least in part by applying a first signal to a first bit-line to selectively conduct the first signal between the first bit-line and the first terminal at least in part responsive to an assertion of a bit-cell select signal, and the circuit may further apply a voltage between the third terminal and the second terminal at least in part by applying a second signal to a second bit-line to selectively conduct the second signal between the second bit-line and the second terminal at least in part to implement an operation to write a first complementary pair of signals and/or states to the first and second MTJ components. In an embodiment, a bit-cell circuit may further include a circuit to apply a logically high voltage level to the third terminal and to apply logically low voltage levels to the first and second bit-lines to implement an operation to write a first complementary pair of signals and/or states to the first and second MTJ components, wherein the first complementary pair of signals and/or states represent a value of "0" stored in the first MTJ and a value of "1" stored in the second MTJ component. In another embodiment, a bit-cell may further comprise a circuit to apply a logically low voltage level to the third terminal and to apply logically high voltage levels to the first and second bit-lines to implement an operation to write a second complementary pair of signals and/or states to the first and second MTJ components, wherein the second complementary pair of signals and/or states represent a value of "1" stored in the MTJ and a value of "0" stored in the second MTJ.

In an embodiment, a first MTJ component may be formed to switch magnetization vector orientation responsive to a current that is greater in magnitude than a current at which the second MTJ component may switch magnetization vector orientation. In a particular implementation, a bit-cell circuit may further include a circuit to apply a subsequent voltage across the third terminal and the second terminal to write a signal and/or state representing a value of "1" in the second MTJ component while maintaining a signal and/or state representative of the value of "1" in the first MTJ component.

In a particular implementation, a bit-cell circuit may also comprise a circuit to sense a voltage level on a read bit-line that may be selectively and/or variably electrically coupled to the metal layer of a non-volatile three-terminal dual storage magnetic memory device to implement an operation to read first and second signals and/or states stored in first and second MTJ components. In another particular implementation, a bit-cell circuit may further include a circuit to precharge first and second bit-lines to logically high voltage levels and to apply a logically low voltage level to the third terminal, wherein the circuit further to selectively couple the first bit-line to the first terminal and to selectively couple the second bit-line to the second terminal responsive to a subsequent assertion of a bit-cell select signal, and wherein the circuit further senses a rate of discharge and/or an amount of current flow and/or a voltage level at the first and second bit-lines to implement an operation to read the first complementary pair of signals and/or states stored at the first and second MTJ components.

In an embodiment, an example process may include storing, at a first magnetic tunnel junction component abutting a first surface of a metal layer, a signal and/or state representative of a first value at least in part by applying a first voltage between a first terminal of the metal layer and a second terminal of the first magnetic tunnel junction component. An example process may further include storing, at a second magnetic tunnel junction component abutting a second surface of the metal layer, a signal and/or state representative of a second value at least in part by applying a second voltage between the first terminal and a third terminal of the second magnetic tunnel junction component. In a particular implementation, an example process may include applying the first voltage and applying the second voltage substantially concurrently.

In a particular implementation, a first MTJ component may comprise one or more free magnetic layers and one or more pinned magnetic layers, wherein at least one of the one or more free magnetic layers are positioned substantially adjacent to the first surface of the metal layer. In an embodiment, a second MTJ component may comprise one or more free magnetic layers and one or more pinned magnetic layers, wherein at least one of the one or more free magnetic layers are positioned substantially adjacent to the second surface of the metal layer. In an embodiment, the metal layer may comprise a spin-orbit-torque (SOT) metal layer, for example.

In an embodiment, an example process may further include applying the first voltage between the first terminal and the second terminal at least in part by applying a first signal to a first bit-line to selectively conduct the first signal between the first bit-line and the second terminal at least in part responsive to an assertion of a bit-cell select signal, and the applying the second voltage between the first terminal and the third terminal at least in part by applying a second signal to a second bit-line to selectively conduct the second signal between the second bit-line and the third terminal at least in part to implement an operation to write a first complementary pair of signals and/or states to the first and second MTJ components. In a particular implementation, an example process may further comprise applying a logically high voltage level to the first terminal and applying logically low voltage levels to the first and second bit-lines to implement the operation to write the first complementary pair of signals and/or states to the first and second MTJ components, wherein the first complementary pair of signals and/or states representing a value of "0" stored in the first MTJ and a value of "1" stored in the second MTJ. In another particular implementation, an example process may also include applying a logically low voltage level to the first terminal and applying logically high voltage levels to the first and second bit-lines to implement an operation to write a second complementary pair of signals and/or states to the first and second MTJ components, wherein the second complementary pair of signals and/or states representative of a value of "1" stored in the MTJ component and a value of "0" stored in the second MTJ component.

In a particular implementation, the first MTJ component may switch magnetization vector orientation at a current greater in magnitude than a current at which the second magnetic MTJ component may switch magnetization vector orientation. In an embodiment, an example process may further include applying a subsequent voltage across the first terminal and the third terminal to write signals and/or states representing a value of "1" in the second MTJ component while maintaining the signal and/or state representing a value of "1" in the first MTJ component.

In an embodiment, an example process may include sensing a voltage level on a read bit-line that may be selectively and/or variably electrically coupled to the metal layer to implement an operation to read the first and second values stored in the first and second MTJ components. An example process may further include pre-charging the first and second bit-lines to logically high voltage levels and applying a logically low voltage level to the third terminal, selectively electrically coupling the first bit-line to the first terminal, selectively electrically coupling the second bit-line to the second terminal responsive to a subsequent assertion of the bit-cell select signal, and sensing a rate of discharge at the first and second bit-lines to implement an operation to read the first complementary pair of signals and/or states stored at the first and second MTJ components.

In the context of the present patent application, the term "connection," the term "component" and/or similar terms are intended to be physical, but are not necessarily always tangible. Whether or not these terms refer to tangible subject matter, thus, may vary in a particular context of usage. As an example, a tangible connection and/or tangible connection path may be made, such as by a tangible, electrical connection, such as an electrically conductive path comprising metal or other conductor, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc. However, a "connection" and/or "component," in a particular context of usage, likewise, although physical, can also be non-tangible, such as a connection between a client and a server over a network, which generally refers to the ability for the client and server to transmit, receive, and/or exchange communications, as discussed in more detail later.

In a particular context of usage, such as a particular context in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are tangibly in direct physical contact. Thus, using the previous example, two tangible components that are electrically connected are physically connected via a tangible electrical connection, as previously discussed. However, "coupled," is used to mean that potentially two or more tangible components are tangibly in direct physical contact. Nonetheless, is also used to mean that two or more tangible components and/or the like are not necessarily tangibly in direct physical contact, but are able to co-operate, liaise, and/or interact, such as, for example, by being "optically coupled." Likewise, the term "coupled" is also understood to mean indirectly connected. It is further noted, in the context of the present patent application, since memory, such as a memory component and/or memory states, is intended to be non-transitory, the term physical, at least if used in relation to memory necessarily implies that such memory components and/or memory states, continuing with the example, are tangible.

In the present patent application, in a particular context of usage, such as a situation in which tangible components (and/or similarly, tangible materials) are discussed above, a distinction exists between being "on" and being "over." As an example, deposition of a substance "on" a substrate refers to a deposition involving direct physical and tangible contact without an intermediary, such as an intermediary substance, between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under"," as used herein, are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes an underlayment embodiment, as one illustration, in which, for example, orientation at various times (e.g., during fabrication or application) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

It is further noted that the terms "type" and/or "like," as used herein, such as with a feature, structure, characteristic, and/or the like, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," if the minor variations are sufficiently minor so that the feature, structure, characteristic, and/or the like would still be considered to be substantially present with such variations also present. It should be noted that the specification of the present patent application merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

Unless otherwise indicated, in the context of the present patent application, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques unless otherwise expressly indicated.

To the extent claimed subject matter is related to one or more particular measurements, such as with regard to physical manifestations capable of being measured physically, such as, without limit, temperature, pressure, voltage, current, electromagnetic radiation, etc., it is believed that claimed subject matter does not fall with the abstract idea judicial exception to statutory subject matter. Rather, it is asserted, that physical measurements are not mental steps and, likewise, are not abstract ideas.

It is noted, nonetheless, that a typical measurement model employed is that one or more measurements may respectively comprise a sum of at least two components. Thus, for a given measurement, for example, one component may comprise a deterministic component, which in an ideal sense, may comprise a physical value (e.g., sought via one or more measurements), often in the form of one or more signals, signal samples and/or states, and one component may comprise a random component, which may have a variety of sources that may be challenging to quantify. At times, for example, lack of measurement precision may affect a given measurement. Thus, for claimed subject matter, a statistical or stochastic model may be used in addition to a deterministic model as an approach to identification and/or prediction regarding one or more measurement values that may relate to claimed subject matter.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation. Likewise, a physical change may comprise a transformation in molecular structure, such as from crystalline form to amorphous form or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state from a binary one to a binary zero or vice-versa in a memory device may comprise a transformation, such as a physical, but non-transitory, transformation. Rather, the foregoing is intended as illustrative examples.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A bit-cell circuit, comprising: one or more non-volatile magnetic memory devices individually comprising:
   a first magnetic tunnel junction component including a first terminal, the first magnetic tunnel junction component abutting a first surface of a metal layer; and
   a second magnetic tunnel junction component including a second terminal, the second magnetic tunnel junction component abutting a second surface, opposite from the first surface, of the metal layer, wherein the metal layer comprises a spin-orbit-torque (SOT) continuous metal layer including a first end and a third terminal at the first end;
   wherein the first magnetic tunnel junction component stores a first signal and/or state responsive to a voltage applied between the third terminal and the first terminal and wherein the second magnetic tunnel junction component stores a second signal and/or state responsive to a voltage applied between the third terminal and the second terminal, and wherein a magnetization vector orientation of one of the first and second magnetic tunnel junction components changes while maintaining a magnetization vector orientation of another of the first and second magnetic tunnel junction components when storing the first signal and/or state or the second signal and/or state.

2. The bit-cell circuit of claim 1, wherein the voltage applied between the third terminal and the first terminal and the voltage applied between the third terminal and the second terminal are applied concurrently.

3. The bit-cell circuit of claim 2, wherein the first magnetic tunnel junction component comprises one or more free magnetic layers and one or more pinned magnetic layers, wherein at least one of the one or more free magnetic layers are positioned substantially adjacent to the first surface of the metal layer.

4. The bit-cell circuit of claim 3, wherein the second magnetic tunnel junction component comprises one or more free magnetic layers and one or more pinned magnetic layers, wherein at least one of the one or more free magnetic layers are positioned substantially adjacent to the second surface of the metal layer.

5. The bit-cell circuit of claim 4, further comprising a circuit configured to apply the voltage between the third terminal and the first terminal at least in part by application of a first signal to a first bit-line to selectively conduct the first signal between the first bit-line and the first terminal at least in part responsive to an assertion of a bit-cell select signal, and wherein the circuit further applies the voltage between the third terminal and the second terminal at least in part by applying a second signal to a second bit-line to selectively conduct the second signal between the second bit-line and the second terminal at least in part to implement an operation to write a first complementary pair of signals and/or states to the first and second magnetic tunnel junction components.

6. The bit-cell circuit of claim 5, further comprising a circuit configured to apply a logically high voltage level to the third terminal and configured to apply logically low voltage levels to the first and second bit-lines to implement the operation to write the first complementary pair of signals and/or states to the first and second magnetic tunnel junction components, wherein the first complementary pair of signals and/or states represents a value of "0" stored in the first magnetic tunnel component and a value of "1" stored in the second magnetic tunnel component.

7. The bit-cell circuit of claim 5, further comprising a circuit configured to apply a logically low voltage level to the third terminal and configured to apply logically high voltage levels to the first and second bit-lines to implement an operation to write a second complementary pair of signals and/or states to the first and second magnetic tunnel junction components, wherein the second complementary pair of signals and/or states represents a value of "1" stored in the first magnetic tunnel component and a value of "0" stored in the second magnetic tunnel component.

8. The bit-cell circuit of claim 5, further comprising a circuit configured to precharge the first and second bit-lines to logically high voltage levels and configured to apply a logically low voltage level to the third terminal, wherein the circuit further selectively couples the first bit-line to the first terminal and selectively couples the second bit-line to the second terminal responsive to a subsequent assertion of the bit-cell select signal, and wherein the circuit further senses a rate of discharge at the first and second bit-lines to implement an operation to read the first complementary pair of signals and/or states stored at the first and second magnetic tunnel junction components.

9. The bit-cell circuit of claim 4, wherein the first magnetic tunnel junction component changes its magnetization vector orientation at a current greater in magnitude than that at which the second magnetic tunnel junction component changes its magnetization vector.

10. The bit-cell circuit of claim 9, further comprising:
a circuit configured to apply the voltage between the third terminal and the first terminal at least in part by application of a first signal to a first bit-line to selectively conduct the first signal between the first bit-line and the first terminal, wherein the first signal is applied to the first bit-line at least in part responsive to an assertion of a bit-cell select signal, and wherein the circuit further applies the voltage between the third terminal and the second terminal at least in part by application of a second signal to a second bit-line to selectively conduct the second signal between the second bit-line and the second terminal at least in part to implement an operation to store a first complementary pair of signals and/or states representative of values "1" and "0" in the first and second magnetic tunnel junction components, respectively; and
a circuit configured to apply a subsequent voltage across the third terminal and the second terminal to store a signal and/or state representative of the value of "1" in the second magnetic tunnel junction component while maintaining the signal and/or state representative of the value of "1" in the first magnetic tunnel junction component.

11. The bit-cell circuit of claim 1, further comprising a circuit configured to sense a voltage level on a read bit-line selectively and/or variably electrically coupled to the metal layer to implement an operation to read the first and second signals and/or states stored in the first and second magnetic tunnel junction components.

12. A method, comprising:
storing, at a first magnetic tunnel junction component abutting a first surface of a metal layer, a signal and/or state representative of a first value by applying only a first voltage between a first terminal at an end of the metal layer and a second terminal of the first magnetic tunnel junction component; and
storing, at a second magnetic tunnel junction component abutting a second surface, opposite from the first surface, of the metal layer, a signal and/or state representative of a second value by applying only a second voltage between the first terminal and a third terminal of the second magnetic tunnel junction component, wherein the metal layer is a spin-orbit-torque (SOT) continuous metal layer, and a magnetization vector orientation of one of the first and second magnetic tunnel junction components changes while maintaining a magnetization vector orientation of another of the first and second magnetic tunnel junction components when storing the first signal and/or state or the second signal and/or state.

13. The method of claim 12, wherein the applying the first voltage and applying the second voltage occur substantially concurrently.

14. The method of claim 13, wherein the first magnetic tunnel junction component comprises one or more free magnetic layers and one or more pinned magnetic layers, wherein at least one of the one or more free magnetic layers are positioned substantially adjacent to the first surface of the metal layer.

15. The method of claim 14, wherein the second magnetic tunnel junction component comprises one or more free magnetic layers and one or more pinned magnetic layers, wherein at least one of the one or more free magnetic layers are positioned substantially adjacent to the second surface of the metal layer.

16. The method of claim 15, further comprising applying the first voltage between the first terminal and the second terminal at least in part by applying a first signal to a first bit-line to selectively conduct the first signal between the first bit-line and the second terminal at least in part responsive to an assertion of a bit-cell select signal, and the applying the second voltage between the first terminal and the third terminal at least in part by applying a second signal to a second bit-line to selectively conduct the second signal between the second bit-line and the third terminal at least in part to implement an operation to write a first complementary pair of signals and/or states to the first and second magnetic tunnel junction components.

17. The method of claim 16, further comprising applying a logically high voltage level to the first terminal and applying logically low voltage levels to the first and second bit-lines to implement the operation to write the first complementary pair of signals and/or states to the first and second magnetic tunnel junction components, wherein the first complementary pair of signals and/or states represent a value of "0" stored in the first magnetic tunnel component and a value of "1" stored in the second magnetic tunnel component.

18. The method of claim 16, further comprising applying a logically low voltage level to the first terminal and applying logically high voltage levels to the first and second bit-lines to implement an operation to write a second complementary pair of signals and/or states to the first and second magnetic tunnel junction components, wherein the second complementary pair of signals and/or states represents the value of "1" stored in the first magnetic tunnel component and the value of "0" stored in the second magnetic tunnel component.

19. The method of claim 16, further comprising:
pre-charging the first and second bit-lines to logically high voltage levels and applying a logically low voltage level to the first terminal;
selectively electrically coupling the first bit-line to the second terminal;
selectively electrically coupling the second bit-line to the third terminal responsive to a subsequent assertion of the bit-cell select signal; and
sensing a rate of discharge at the first and second bit-lines to implement an operation to read the first complementary pair of values stored at the first and second magnetic tunnel junction components.

20. The method of claim 15, wherein the first magnetic tunnel junction component switches its magnetization vector orientation in response to a current higher in magnitude than that at which the second magnetic tunnel junction component switches its magnetization vector orientation.

21. The method of claim 12, wherein the applying the first voltage between the first terminal of the metal layer and the second terminal of the first magnetic junction component comprises applying the first voltage between the first terminal of the metal layer and the second terminal of the first magnetic junction component at least in part by selectively conducting a first signal between a first bit-line and the second terminal of the first magnetic junction component and wherein the applying the second voltage between the first terminal of the metal layer and the third terminal of the second magnetic junction component comprises applying the second voltage between the first terminal of the metal layer and the third terminal of the second magnetic junction component at least in part by selectively conducting a second signal between a second bit-line and the third terminal of the second magnetic junction component at least in part to implement an operation to store a first complementary pair of signals and/or states representative of values "1" and "0" in the first and second magnetic tunnel junction components, respectively; and applying a subsequent voltage across the first terminal of the metal layer and the third terminal of the second magnetic junction component to store a signal and/or state representative of a value of "1" in the second magnetic tunnel junction component while maintaining the signal and/or state representative of the value of "1" in the first magnetic tunnel junction component.

22. The method of claim 12, further comprising sensing a voltage level on a read bit-line selectively and/or variably electrically coupled to the metal layer to implement an operation to read the signals and/or states representative of the first and second values stored in the first and second magnetic tunnel junction components.

* * * * *